(12) United States Patent
Dolgos et al.

(10) Patent No.: US 11,384,450 B2
(45) Date of Patent: Jul. 12, 2022

(54) METHOD OF MAKING THIN FILMS

(71) Applicant: OREGON STATE UNIVERSITY, Corvallis, OR (US)

(72) Inventors: Michelle Dolgos, Corvallis, OR (US); Dylan Fast, Corvallis, OR (US); May Nyman, Corvallis, OR (US); Brady J. Gibbons, Corvallis, OR (US); Matthew O. Clark, Corvallis, OR (US)

(73) Assignee: OREGON STATE UNIVERSITY, Corvallis, OR (US)

( * ) Notice: Subject to any disclaimer, the term of this patent is extended or adjusted under 35 U.S.C. 154(b) by 30 days.

(21) Appl. No.: 16/972,997

(22) PCT Filed: Jun. 13, 2019

(86) PCT No.: PCT/US2019/036902
§ 371 (c)(1),
(2) Date: Dec. 7, 2020

(87) PCT Pub. No.: WO2019/241474
PCT Pub. Date: Dec. 19, 2019

(65) Prior Publication Data
US 2021/0254239 A1 Aug. 19, 2021

Related U.S. Application Data

(60) Provisional application No. 62/684,834, filed on Jun. 14, 2018.

(51) Int. Cl.
*C30B 7/04* (2006.01)
*C30B 29/30* (2006.01)
(Continued)

(52) U.S. Cl.
CPC .............. *C30B 29/30* (2013.01); *B05D 1/005* (2013.01); *C01G 33/006* (2013.01); *C30B 7/04* (2013.01);
(Continued)

(58) Field of Classification Search
CPC ........... C30B 29/30; C30B 7/04; B05D 1/005; C01G 33/006; H01L 41/317
See application file for complete search history.

(56) References Cited

U.S. PATENT DOCUMENTS

2009/0177049 A1 7/2009 Eriksson et al.
2015/0303371 A1* 10/2015 Ueno .................. B41J 2/14201
347/68

(Continued)

OTHER PUBLICATIONS

Goh et al, "Hydrothermal synthesis of KNb)3 and NaNb)3 powders" J. Material Research vol. 18, No. 2 Feb. 2003 338-345.*

(Continued)

*Primary Examiner* — Robert M Kunemund
(74) *Attorney, Agent, or Firm* — Schwabe, Williamson & Wyatt, P.C.

(57) ABSTRACT

Embodiments disclosed herein include potassium sodium niobate (KNN) films and methods of making such films. In an embodiment, a method of forming a potassium sodium niobate (KNN) film comprises preparing a solution comprising water, potassium hexaniobate salts, and sodium hexaniobate salts. In an embodiment, the solution is spin coated onto a substrate to form a film on at least a portion of a surface of the substrate. In an embodiment, the method may further comprise heat treating the film.

15 Claims, 5 Drawing Sheets

(51) Int. Cl.
B05D 1/00 (2006.01)
C01G 33/00 (2006.01)
H01L 41/317 (2013.01)

(52) U.S. Cl.
CPC ........ H01L 41/317 (2013.01); *C01P 2006/40* (2013.01)

(56) References Cited

U.S. PATENT DOCUMENTS

2018/0138393 A1* 5/2018 Sumi .................... H01L 41/1873
2018/0138394 A1* 5/2018 Kitada .................. H01L 41/318

OTHER PUBLICATIONS

Korean Intelectual Property Office, International Search Report and Written Opinion of the International Searching Authority in PCT/US2019/036902, dated Oct. 15, 2019, 10 pages.

Handoko, Albertus D., et al., "Hydrothermal synthesis of sodium potassium niobate solid solutions at 200° C.", Green Chemistry, vol. 12, 2020,pp. 680-687.

Maziatiakmal, M. H., et al., "Optimizing the processing conditions of sodium potassium niobate thin films prepared by sol-gel spin coating technique", Ceramics International, vol. 44, Issue 1, Jan. 2018, pp. 317-325.

Ozeren, Yagiz, et al., "Sodium niobate particles with controlled morphology synthesized by hydrothermal method and their use as templates in KNN fibers", Advanced Powder Technology, vol. 25, 2015, pp. 1825-1833.

Shi, Guodong, et al., "Hydrothermal synthesis of morphology-controlled KNbO3, NaNbO3, and (K,Na)NbO3 powders", Ceramics International, vol. 43, 2017, p. 7222-7230.

* cited by examiner

METHOD OF MAKING THIN FILMS

CROSS-REFERENCE TO RELATED APPLICATION

This application is a national phase entry under 35 U.S.C. § 371 of International Application No. PCT/US2019/036902, filed 13 Jun. 2019, which designates the United State of America, which claims the priority benefit of the earlier filing date of U.S. Provisional Application No. 62/684,834, filed on 14 Jun. 2018, the entire disclosures of each of these applications are hereby incorporated by reference in their entireties and for all purposes.

FEDERAL FUNDING

This invention was made with government support under grant No. CHE1606982 awarded by the National Science-Foundation. The government has certain rights in the invention.

BACKGROUND OF THE INVENTION

Potassium sodium niobate (KNN) is a leading candidate for the ongoing push to move to lead-free ferroelectric materials. Typical synthetic routes for thin films commonly utilize sol-gel chemistry or nitrate containing solutions, which can lead to problems in terms of processing and handling.

Ferroelectrics and piezoelectrics are a frequently utilized class of materials for many modern electronic devices, including sensors, actuators, RF filters, and non-volatile computer memory. The growing need for robust, low power, and compact components for portable electronics is rapidly driving the growth of the piezoelectric market. One of the most commonly used ferroelectrics is lead zirconium titanate (PZT), due to its high piezoelectric response and thoroughly studied processing parameters. However, growing regulation on the lead content of modern devices has driven substantial research into alternative materials that can replace PZT. Electronics waste is an increasingly significant issue due to the low cost and ubiquity of cell phones, tablets, and a growing field of devices that fall under the emerging Internet of things. With the rising demand for piezoelectrics and increasing trends towards sustainable practices, there is substantial pressure to develop a variety of new piezoelectric and ferroelectric materials tailored for specific applications.

Potassium Sodium Niobate is an oft-researched candidate for this ongoing lead-free push due to its relatively high $d_{33}$, Curie temperature (Tc), and the benign elemental constituents. Maximizing these properties relies on careful control of the alkali to Nb ratio to generate a solid solution at a phase boundary. This is a common strategy in much ferroelectric research and nearly all high-performing ferroelectrics including PZT are designed with this phase boundary in mind. This is complicated by the stoichiometry changes induced by volatility of the alkalis at high temperature, often necessitating the inclusion of excess sodium and potassium to combat losses during calcination and sintering. The production of thin films using these materials only serves to exacerbate this issue due to the high surface area, necessitating higher amounts of excess or lowering anneal temperatures.

DETAILED DESCRIPTION OF THE INVENTION

Figure 1A:
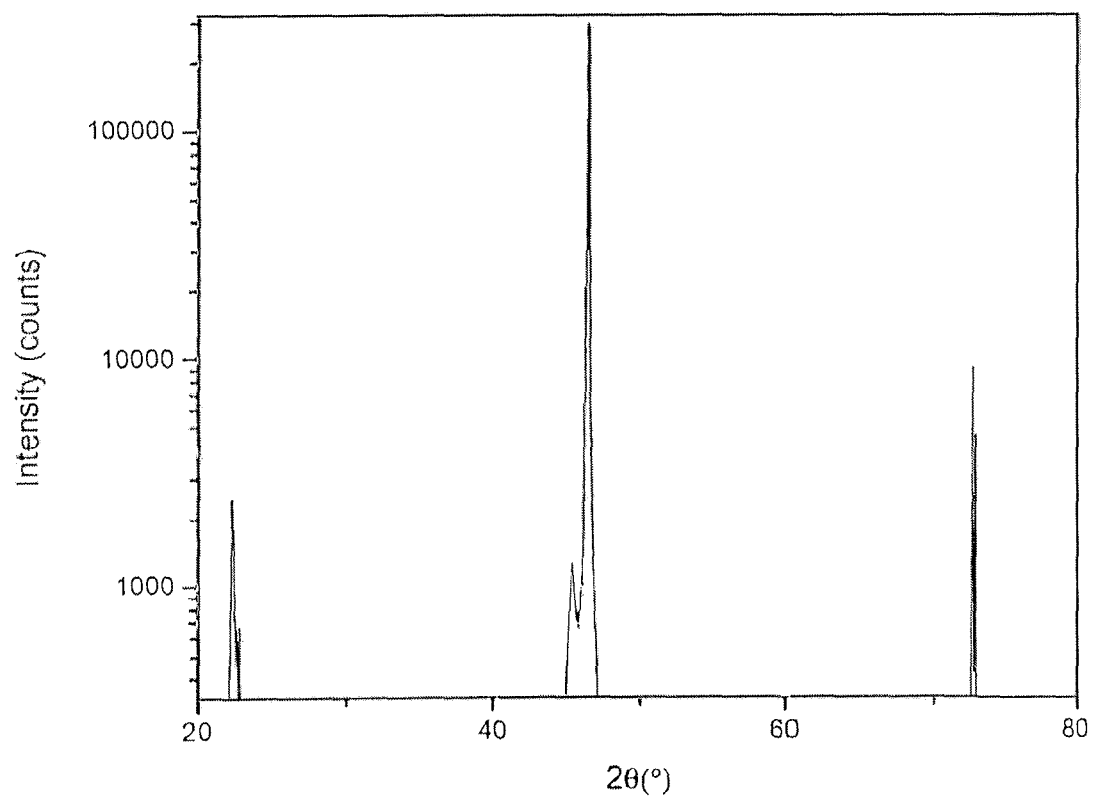
FIG. 1A shows XRD of KNN film on Nb:SrTiO$_3$.

The present invention is described in the following disclosure with reference to any figures, in which any like numerals represent the same or similar elements, and sequence listings. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

In embodiments, the present disclosure relates to a new synthetic pathway for making KNN based thin films.

In embodiments, the methods of the present disclosure employ polyoxometalate chemistry in the form of $X_8Nb_6O_{19}$ (X=Na, K, H) salts for making KNN based thin films. These $[Nb_6O_{19}]^{8-}$ clusters are soluble in water and stable in air, allowing for simpler coating of substrates with benign components. These clusters maintain appropriate alkali:niobium ratios in the transition from solution to film due to charge balancing effects. The alkali content is tunable based on control of pH and subsequent protonation of the hexaniobate cluster, allowing for a high degree of control of alkali excesses. Epitaxial growth of the KNN is observed using this process on any oriented substrate, such as an (001) oriented substrate. In an embodiment, the substrate may comprise lattice parameters (e.g., a and b lattice parameters) that differ from the corresponding lattice parameters of the KNN film by approximately 15% or less. For example, some suitable substrates for growing KNN films using methods disclosed herein may include, but are not limited to, SrTiO$_3$, LaAlO$_3$, MgO, BaZrO$_3$, and NdGaO$_3$. This synthetic approach demonstrates a flexible new pathway to niobate (Nb) based thin films with an emphasis on the sustainable chemical practices that are at the heart of modern chemistry and the push for lead-free ferroelectrics.

In embodiments, the present disclosure provides a new synthetic method for the creation of KNN thin films based on classic spin-coating. By leveraging polyoxometalate chemistry, simple $[Nb_6O_{19}]^{-8}$ (Nb$_6$) clusters can be synthesized that readily form salts with alkalis. Simple charge balance forces the alkali cations and hexaniobate anions to remain paired. The alkali content is demonstrated to be tunable based on acidification of the cluster down to from approximately pH 12.5 to pH 11.0, for example from approximately pH 11.5 to pH 11.0, or from approximately pH 12.0 to pH 11.5, allowing for precise control of the final solid solution by adjusting this and the relative ratios of sodium and potassium salts of the cluster in solution. In embodiments, the synthetic methods described herein circumvent many of the common problems in the creation of KNN based and many other ferroelectric films. For example, in embodiments, the synthetic methods described herein do not require the use of a vacuum chamber. In embodiments, another advantage to the disclosed methods is the use of air stable precursors that are soluble in water instead of organic solvents. In embodiments, another advantage to the disclosed methods is that there are no other ions or molecules present in the final solution used to make the films that do not compose the KNN except water; i.e. the use of nitrate in the final film is avoided. Furthermore, there will be no impurities in the resulting KNN. Accordingly, there is nothing to be removed from the film by heating, ion exchange or dissolution, all of which can lead to porosity in the resulting KNN. Therefore, embodiments disclosed herein allow for the generation of high purity and low porosity KNN films.

In some embodiments, the present disclosure relates to making potassium sodium niobate from hexaniobate cluster precursors. In embodiments, potassium hexaniobate may be formed by reacting hydrated niobium oxide (niobic acid) with potassium hydroxide. By way of non-limiting example, a solution of about 2-4M KOH is prepared and heated with stirring on a hot plate. The solution of KOH is heated to 90° C. and niobic acid is added slowly until all the solids are dissolved, ensuring that an excess of potassium to total dissolved niobium is maintained. This is refluxed at 90° C. for at least an hour and then the $K_8Nb_6O_{19}$ salt may be precipitated. In an embodiment, the precipitation of the $K_8Nb_6O_{19}$ salt may be accelerated by the addition of ethanol. In some embodiments, the precipitated $K_8Nb_6O_{19}$ may be washed with more ethanol.

In embodiments, sodium hexaniobate is formed through dissolution of the potassium hexaniobate salt in water to which an excess of sodium hydroxide, such as 1M sodium hydroxide is added. The sodium hexaniobate salt is then precipitated in the same way as above, through addition of ethanol and then optionally washed in additional ethanol. Similar to the $K_8Nb_6O_{19}$, the sodium hexaniobate salt may also be precipitated without adding ethanol. This process may be repeated to fully exchange all of the potassium for sodium. The potassium hexaniobate and sodium hexaniobate salts can be dissolved in water and used as is, but optionally, and in some embodiments preferably, the pH of one or both of the salts in solution is lowered through the addition of a dilute acid (for example, HCl or $HNO_3$) and then again precipitated through addition of ethanol to provide protonated hexaniobate clusters and thereby modify the ratios of alkalis left in solution ranging from approximately X:Nb=8:6 to approximately 6:6 (X=Na, K). These solutions are mixed together in varying ratios depending on the desired target composition of the film. Achieving typical target compositions of $K_{0.5}Na_{0.5}NbO_3$ typically requires mixtures of $KNb_6$:$NaNb_6$ in the range between approximately 1.2:0.8 and approximately 1:1 (nominally 1.14:0.86 in prior trials). Optionally, hydrogen peroxide is added to improve the solubility of the clusters in solution. In some cases, small amounts of lithium, silver, cesium, manganese, antimony, tantalum, bismuth, or tin compounds that are water soluble may be added in atom % concentrations of approximately 0.01% to approximately 5% with respect to niobium (e.g. $xLiNbO_3$-(1−x)($K_{0.5}Na_{0.5}NbO_3$)). These serve to modify the dielectric and ferroelectric properties (such as $d_{33}$ or Tc) of the material or aid in densification and sintering of the films.

In embodiments, the solution of potassium and sodium $Nb_6$ salts is added dropwise to a target substrate. Example substrates include sapphire ($Al_2O_3$) or single crystal $SrTiO_3$. The films may be annealed in a rapid thermal annealing system to with temperatures from approximately 600° C. to approximately 1000° C. and held at that temperature for approximately 1-5 minutes before cooling. Dropwise addition and annealing may be repeated until the desired thickness of film in the range of approximately 10 nm to approximately 10,000 nm is achieved.

EXAMPLES

Example 1. Synthesizing the Potassium Hexaniobate Precursors

Potassium hexaniobate $K_8Nb_6O_{19}$ was synthesized as described by Nyman et al. (M. Nyman, T. M. Alam, F. Bonhorrune, M. A. Rodriguez, C. S. Frazer, and M. E. Welk, "Solid-state Structures and Solution Behavior of Alkali Salts of the $[Nb_6O_{19}]^8[Nb_6O_{19}]^{8-}$ Lindqvist Ion," J. Clust. Sci., vol. 17, no. 2, pp. 197-219, March 2006). A solution of XM KOH was heated to 90° C. Hydrated $Nb_2O_5$ was added fractionally to the solution with constant stirring. Once the solids were completely introduced and dissolved the solution was held at 90° C. for 1 hour and cooled in ambient conditions. This solution was added to ethanol to precipitate the potassium hexaniobate. Excess ethanol was decanted and the slurry was placed in centrifuge tubes where it was washed with more ethanol and then centrifuged at 6000 rpm for 30 minutes to separate the solids. Again the ethanol was decanted and the $K_8Nb_6O_{19}$ salt was dried at 110° C. for 4 hours until dry to the touch. To determine water content in the hydrated salt the samples are weighed and then annealed to 700° C. for 1 hour with a ramp rate of 10° C./min. Typical formulations of the solid with this procedure are $K_8Nb_6O_{19}.5H_2O$. The resulting powder was re-dissolved in minimal water and acidified with 0.1M HCl until the solution reached a pH of 12 and then recrystallized and washed using the same procedure to form the singly protonated $HK_7Nb_6O_{19}$ salt.

Example 2. Synthesizing the Sodium Hexaniobate Precursors

The potassium hexaniobate was dissolved in a minimal amount of water and then added to 1 L of 1M NaOH with constant stirring. A white precipitate quickly crashed out of solution and the mixture was left to stir for approximately 1 hour to fully react. The solution was then placed in a centrifuge and spun at 6000 rpm for 30 minutes to collect the precipitate. This salt was also dried at 110° C. for 4 hours and similarly heated to 700° C. for 1 hour at a ramp rate of 10° C./min to determine water content. Typical formulations of the solid under this procedure are $HNa_7Nb_6O_{19}.3H_2O$. No acidification step was used for the sodium salt due to it already being singly protonated. This procedure was first reported prior for $Li_7K[Nb_6O_{19}].15H_2O$ (Travis Anderson et al., A Lindqvist-Supported Lithium-Water Adamantane Cluster and Conversion of Hexaniobate to a Discrete Keggin Complex, Crystal Growth & Design, 2007 7 (4), 719-723).

Specifically as described in Travis Anderson et al.; 2.00 g sample of $Rb_8[Nb_6O_{19}].14H_2O$ was dissolved in 10 mL of deionized water and added to ~700 ml lM LiOH solution, and allowed to sit for 3 days to improve the yield. The source of the K+ was unknown. It could be a contamination or impurity from any of the steps in the reaction. This can be eliminated by multiple treatments with LiOH. This synthesis was later adapted to obtain $Li_8[Nb_6O_{19}].15.5H2O$ from $K_8[Nb_6O_{19}].xH_2O$ (Hou et al., The atomic level journey from aqueous polyoxometalate to metal oxide, Journal of Solid State Chemistry, Volume 221, January 2015, Pages 418-425). Five grams of $K_8[Nb_6O_{19}].xH_2O$ was dissolved in a minimal amount of water and added to 1 L 1M LiOH solution. This was left for two days. In this experiment, no residual K was observed. Similar to the procedure disclosed herein, the compound with the correct amount of lithium was obtained by acidification. 0.2 g $Li_8[H_2Nb_6O_{19}]\cdot 14H_2O$ in 40 ml $H_2O$ was acidified from pH 11.8 to 11.0 by 0.1M HCl. Then, 120 ml isopropanol was added into that solution to form a cloudy solution which was centrifuged for 1 h. The obtained solid was collected, washed by isopropanol for three times and air dried at room temperature. $LiNbO_3$ thin films have been deposited from $Li_6[H_2Nb_6O_{19}]\cdot xH_2O$. Briefly, 50 mM solution was prepared from $Li_6[H_2Nb_6O_{19}]\cdot xH_2O$. Films were deposited on substrates by spin coating at 3000 rpm for 30 s, followed by an immediate hot plate cure at 80° C. for 3 min. The deposited films were then annealed in air at selected temperatures in the range 600-900° C. for 1 min.

Example 3. Synthesizing the Thin Film

Solutions of the potassium hexaniobate and sodium hexaniobate precursors were mixed together in 1.14:0.86 ratios in water to make a 50 mM solution with respect to the $Nb_6$ cluster. The rationale behind differing concentrations of the two precursors is both that the two precursors have differing amounts of sodium and potassium and the solubility of the potassium precursor is notably higher than the sodium one, which impacts the relative percentages of the two precursors that remain on the substrate. These solutions are deposited on $SrTiO_3$ or $Al_2O_3$ substrates dropwise and spun at 3000 rpm for 30 seconds. These gel-like films are set and dehydrated by placing the substrate on a hot plate at 300° C. for 3 minutes. To minimize alkali volatility the films are then annealed in a rapid thermal annealing system at 700° C. for 1 minute. This process is repeated to build film thickness with each layer depositing approximately 30 nm of material. All characterized films in this work were made using eight layers for a total thickness of approximately 240 nm.

Example 4. X-Ray Diffraction

Film samples were evaluated for phase purity using a Rigaku Ultima X-Ray diffractometer (XRD) with Cu—Kα radiation. Patterns of films on alumina were collected from 3°-90° using grazing incidence X-ray diffraction (GIXRD) with an incident angle of 0.35° and a scan rate of 2°/min. Patterns of samples on $SrTiO_3$ were collected in standard θ/2θ from 3°-90° geometry to highlight oriented growth. Rocking curve measurements and phi scans were also performed on the $KNN/SrTiO_3$ samples to evaluate the degree of orientation.

Example 5. Surface Characterization

Film samples were characterized using a Quanta 3D scanning electron microscope equipped with an energy dispersive spectrometer (EDS). Samples were analyzed at a 10 kV accelerating voltage with a 60 s acquisition time for EDS measurements.

Surface roughness was evaluated with an Asylum atomic force microscope (AFM). Data was collected with a 150 kHz resonant frequency tip in tapping mode. Images were collected with 1 μm and 5 μm scan sizes in a 512×512 grid.

Example 6. Phase Analysis

Figure 1B:
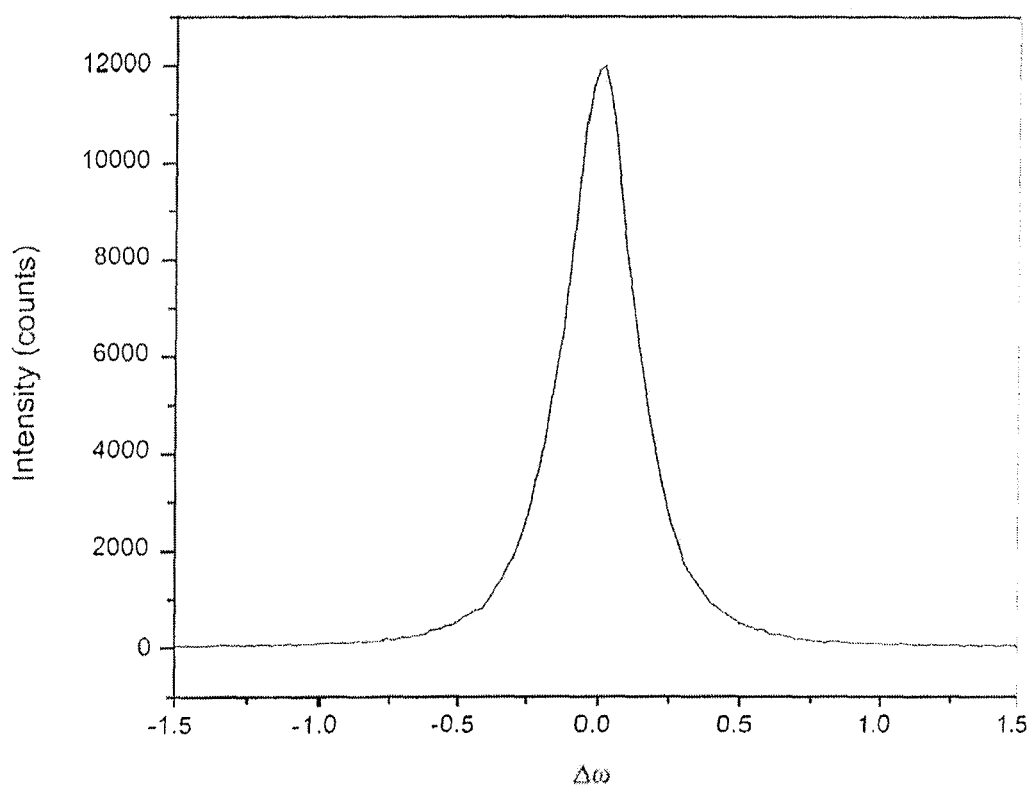
FIG. 1B shows rocking curve measurement of the film shown in FIG. 1A.
Figure 2:
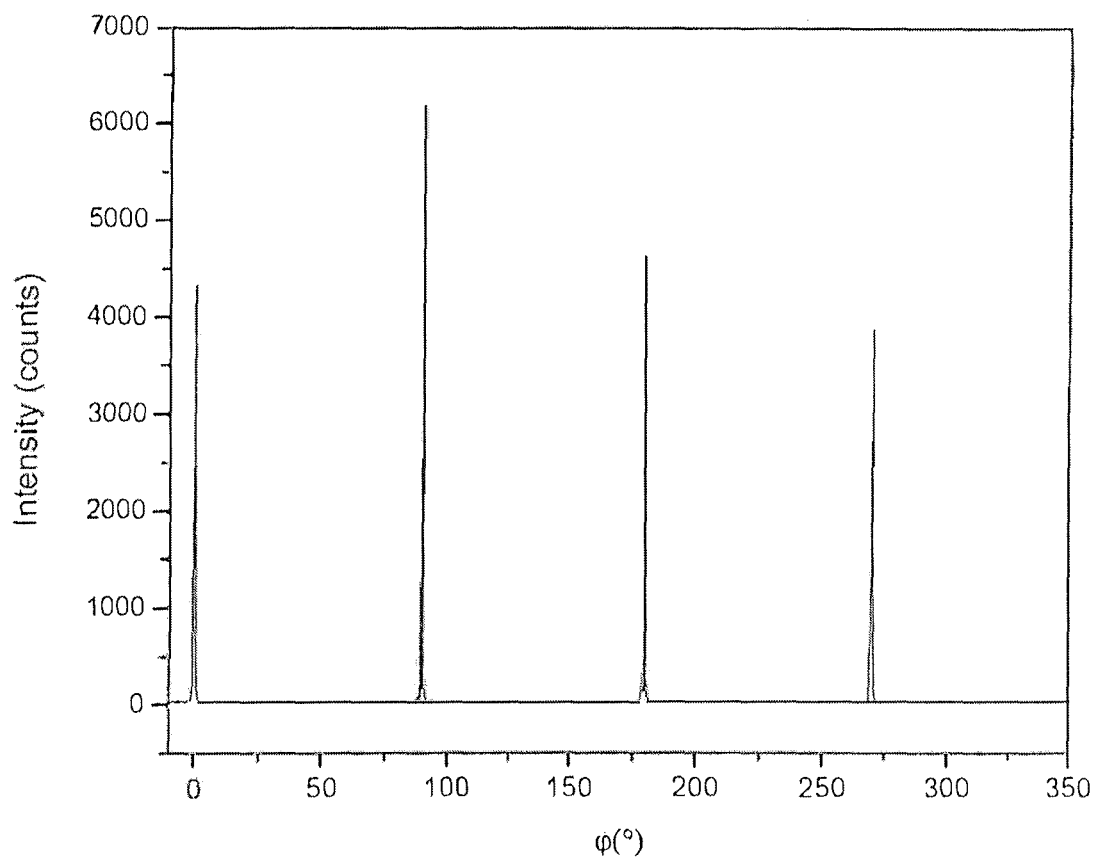
FIG. 2 shows Phi scan of KNN Film on Nb:SrTiO$_3$.
Figure 3:
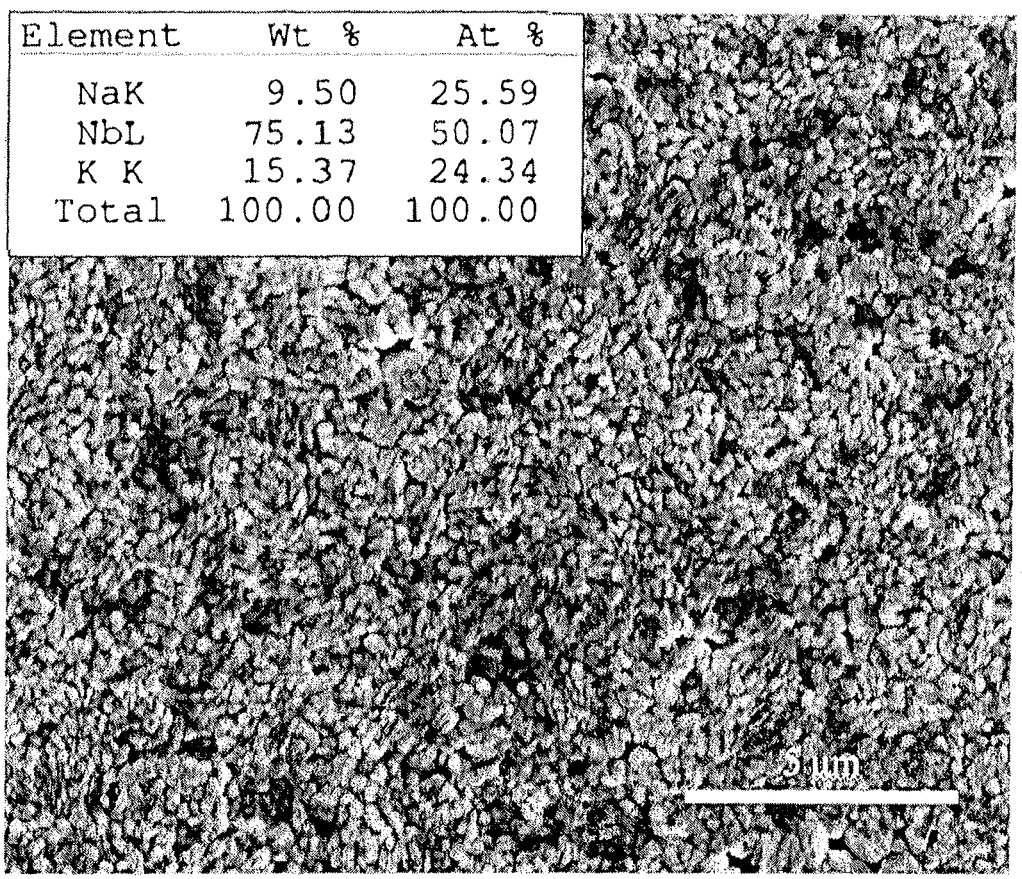
FIG. 3 shows SEM data of KNN film on sapphire.

Films were determined to be phase pure using standard XRD techniques. Due to the small amount of total sample, polycrystalline films on sapphire were measured using grazing incidence geometry, which show good agreement with the expected perovskite pattern of KNN in FIG. 1. Films on $SrTiO_3$ were measured with a standard θ/2θ geometry to evaluate the degree of orientation. FIG. 2 shows that these films are aligned well to the (001) plane of the substrate and rocking curve measurements show a FWHM of 0.28°, which is competitive with other synthetic routes to KNN. Finally, a pole figure measurement is also performed to ensure that films are truly epitaxial, shown in FIG. 3. These metrics demonstrate that this synthetic method provides a straightforward and effective route to oriented film growth on an appropriate substrate.

Example 7. Film Evaluation

Figure 4:
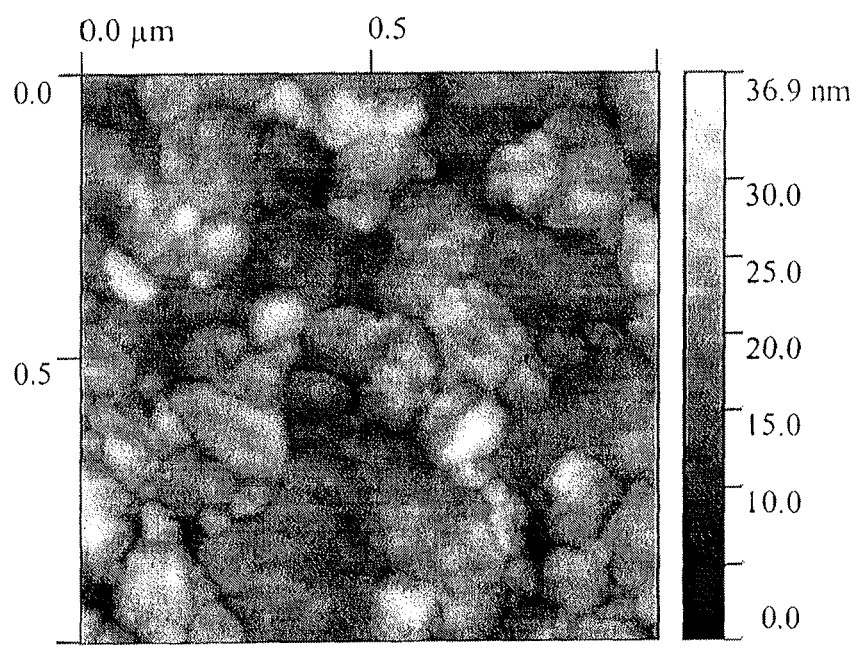
FIG. 4 shows AFM data of KNN film on sapphire. Grayscale indicates Z-axis of film.

Film surfaces and grain growth play a critical role in the properties of functional ferroelectric films. Highly porous or irregular films are prone to failure and will have poor physical properties. SEM data (FIG. 3) was collected to evaluate surface morphology of the annealed films and it was found that grains crystallized homogenously. AFM data (FIG. 4) was collected to evaluate further the surface and the RMS roughness was found to be approximately 5 nm. These results show good crystallization of KNN on the target substrates and indicate dense and smooth films are being formed.

Volatility is a significant concern when working with alkalis at high temperatures and this problem is only exacerbated when moving to thin film geometries due to huge surface area to volume ratios. Many synthetic procedures for both bulk and film KNN synthesis add excess alkalis to the system in order to combat these issues. Fortunately, the hexaniobate salts clusters in their unprotonated state are charge balanced by eight alkalis so this excess is enforced by the precursor chemistry. This ratio is controllable by adjusting the pH within the range of approximately 10-14, approximately 10-12, approximately 12-14, or approximately 11-13 to protonate the cluster, thereby reducing the number of alkalis balancing the charge. EDS was used to confirm the final alkali ratios and assist in the tuning of precursor ratios for film synthesis. Results in FIG. 3. show that a ratio of 1.14:0.86 $KNb_6:NaNb_6$ yielded the desired final stoichiometry. This discrepancy from a 1:1 ratio of precursors yielding the desires composition likely stems primarily from differences in solubility of the two cluster salts, with the potassium precursor having a much higher solubility.

Sustainable and environmentally friendly pathways to new materials are increasingly important for scaling material syntheses in modern times. This disclosure provides methods for making potassium sodium niobate thin films more viable at a larger scale with water as a solvent and by leveraging polyoxometalate chemistry, which takes inspiration from geochemical processes. The removal of organic components such as 2-methoxyethanol or other ions such as nitrate commonly used in KNN film depositions reduces the need for burn out processes and more importantly substantially reduces toxicity concerns. Films are shown to be of high quality in terms of X-ray characterization and surface morphology, homogenously coating the substrate and growing epitaxially when deposited on (001) oriented $SrTiO_3$ substrates.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of forming a potassium sodium niobate (KNN) film, comprising:
   preparing a solution comprising:
      water;
      potassium hexaniobate salts; and
      sodium hexaniobate salts;
   spin coating the solution onto a substrate to form a film on at least a portion of a surface of the substrate; and
   heat treating the film.

2. The method of claim 1, wherein one or both of the potassium hexaniobate salts and the sodium hexaniobate salts are protonated.

3. The method of claim 2, wherein a ratio of alkali to niobium (X:Nb, where X is potassium or sodium) of the protonated sodium hexaniobate salts and/or the protonated potassium hexaniobate salts is from about 8:6 to about 6:6.

4. The method of claim 1, wherein a ratio of potassium hexaniobate salts to sodium hexaniobate salts in the solution is from 1.2:0.8 to 1:1.

5. The method of claim 4, wherein the ratio of potassium hexaniobate salts to sodium hexaniobate salts in the solution is 1.14:0.86.

6. The method of claim 1, wherein the solution further comprises one or more of lithium, silver, cesium, manganese, antimony, tantalum, bismuth, and tin compounds that are water soluble.

7. The method of claim 1, wherein the solution further comprises hydrogen peroxide.

8. The method of claim 1, wherein the substrate comprises $Al_2O_3$ or single crystal $SrTiO_3$.

9. The method of claim 1, wherein the operations of spin coating the solution onto the substrate and heat treating the film are repeated a plurality of times.

10. The method of claim 9, wherein the film has a thickness from about 10 nm to about 10,000 nm.

11. The method of claim 1, wherein heat treating the film comprises annealing the film in a rapid thermal annealing system with a temperature that ranges from about 600° C. to about 1,000° C. and for a period of time that ranges from about 1 minute to about 5 minutes.

12. The method of claim 1, wherein the potassium hexaniobate salts are prepared by:
   reacting hydrated niobium oxide with potassium hydroxide; and
   precipitating the potassium hexaniobate salts.

13. The method of claim 12, wherein preparing the potassium hexaniobate salts further comprises supplying a dilute acid to dissolved potassium hexaniobate salts in order to precipitate protonated potassium hexaniobate salts.

14. The method of claim 1, wherein the sodium hexaniobate salts are prepared by:
   dissolving potassium hexaniobate salts in water with an excess of sodium hydroxide; and
   precipitating the sodium hexaniobate salts.

15. The method of claim 14, wherein preparing the sodium hexaniobate salts further comprises supplying a dilute acid to the dissolved sodium hexaniobate salts in order to precipitate protonated sodium hexaniobate salts.

* * * * *